US007733185B2

(12) United States Patent
Suzuki (10) Patent No.: US 7,733,185 B2
(45) Date of Patent: Jun. 8, 2010

(54) DISTRIBUTED AMPLIFIER AND INTEGRATED CIRCUIT

(75) Inventor: Yasuyuki Suzuki, Minato-ku (JP)

(73) Assignee: NEC Corporation, Tokyo (JP)

( * ) Notice: Subject to any disclaimer, the term of this patent is extended or adjusted under 35 U.S.C. 154(b) by 106 days.

(21) Appl. No.: 12/089,862

(22) PCT Filed: Aug. 14, 2006

(86) PCT No.: PCT/JP2006/316022

§ 371 (c)(1),
(2), (4) Date: Apr. 10, 2008

(87) PCT Pub. No.: WO2007/049391

PCT Pub. Date: May 3, 2007

(65) Prior Publication Data

US 2009/0231043 A1    Sep. 17, 2009

(30) Foreign Application Priority Data

Oct. 24, 2005    (JP)    ............................. 2005-308270

(51) Int. Cl.
*H03F 3/60* (2006.01)
*H03F 3/68* (2006.01)
(52) U.S. Cl. ...................................... 330/286; 330/295
(58) Field of Classification Search ................. 330/286, 330/295
See application file for complete search history.

(56) References Cited

U.S. PATENT DOCUMENTS 6,463,267 B1 * 10/2002 Akamine et al. ......... 455/253.2

6,727,762 B1 * 4/2004 Kobayashi ................... 330/295

FOREIGN PATENT DOCUMENTS

| JP | 2-60215 A | 2/1990 |
|---|---|---|
| JP | 3-165108 A | 7/1991 |
| JP | 5-136641 A | 6/1993 |
| JP | 6-125224 A | 5/1994 |
| JP | 7-170138 A | 7/1995 |
| JP | 9-266420 A | 10/1997 |
| JP | 2001-7657 A | 1/2001 |

* cited by examiner

*Primary Examiner*—Steven J Mottola
(74) *Attorney, Agent, or Firm*—Sughrue Mion, PLLC (57) ABSTRACT

A plurality of transistors operate as amplification elements. An input side coupling circuit comprises a plurality of distributed constant lines connected in series, one terminal of which is an input terminal and the other terminal of which is a bias input terminal. Each of the connection nodes between these distributed constant lines is connected to each of the inputs of the transistors. An output side coupling circuit comprises a plurality of distributed constant lines connected in series, one terminal of which is an output terminal and the other terminal of which is a bias input terminal. Each of the connection nodes between these distributed constant lines is connected to each of the outputs of the transistors. A termination circuit is provided at the input side coupling circuit or the output side coupling circuit. The termination circuit comprises: a first resistor connected between the bias input terminal and a power supply; and a second resistor connected between this bias input terminal and the ground voltage. The resistance value of the first resistor is equal to or less than that of the second resistor.

10 Claims, 4 Drawing Sheets

DISTRIBUTED AMPLIFIER AND INTEGRATED CIRCUIT

TECHNICAL FIELD

The present invention relates to an amplifier, and more particularly, to a distributed amplifier which is used for amplification of wide band signals.

BACKGROUND ART

In recent years, advanced signal processing is required for a variety of communication systems, leading to a need for integrated circuits which are capable of wideband signals. In particular, the transmission rate is remarkably increased in optical communication systems, and a 2.4 Gigabits/second (Gb/s) system and a 10 Gb/s system have been brought into practical use. Further, research and developments have been in progress for systems having a transmission rate of 40 Gb/s or higher.

Multiplexed signals transmitted in such an optical communication system include frequency components which span a wide band from several tens of kilohertz (kHz) to several tens of Gigahertz (GHz). For this reason, amplifiers used in transceivers are required to provide a flat gain over a wide band from several tens of kHz to several tens of GHz. A distributed amplifier (for example, see JP-6-125224-A) is an example of such a wideband amplifier.

Figure 1:
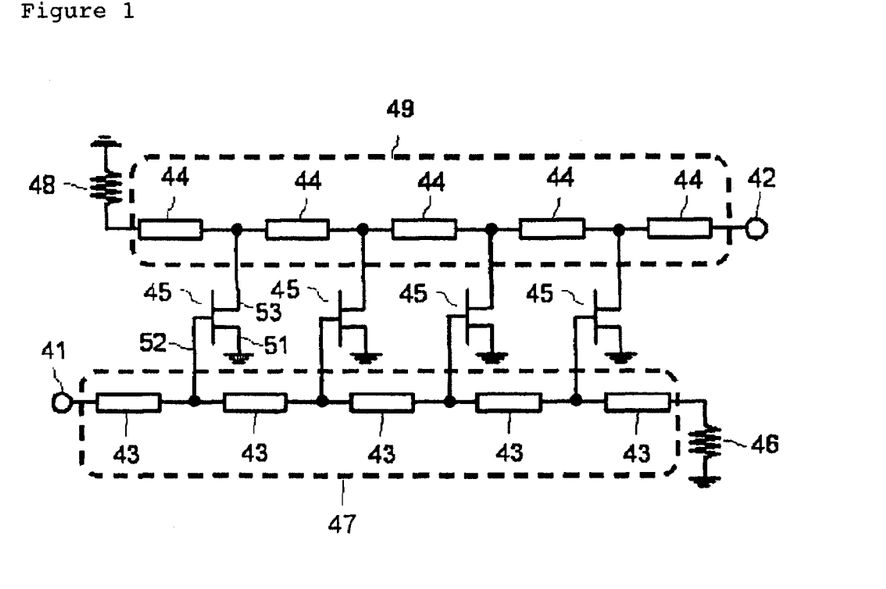

FIG. 1 is a circuit diagram showing an exemplary configuration of a distributed amplifier. Referring to FIG. 1, the distributed amplifier comprises, by way of example, a plurality of field effect transistors (FET) 45, input side termination resistor 46, input side coupling circuit 47, output side termination resistor 48, and output side coupling circuit 49. Input side coupling circuit 47 comprises a plurality of distributed constant lines 43 connected in series. Output side coupling circuit 49 comprises a plurality of distributed constant lines 44 connected in series.

One terminal of input side coupling circuit 47 is input terminal 41, and the other terminal is connected to one terminal of input side termination circuit 46. Also, the other terminal of input side termination resistor 46 is grounded. Then, input terminal 52 of each of the plurality of FETs 45 is connected to each connection of distributed constant lines 43, which are commented to each other, in input side coupling circuit 47.

Output terminal 53 of each of the plurality of FETs 45 is connected to each connection of distributed constant lines 44, which are connected to each other, in output side coupling circuit 49. Then, A terminal further away from input terminal 41 of output side coupling circuit 49 is output terminal 42, and the other terminal is connected to one terminal of output side termination resistor 48. The other terminal of output side termination resistor 48 is grounded.

In such a distributed amplifier, distributed constant line 43 and capacitance $C_{gs}$ between gate and source of FET 45 adjacent thereto form a pseudo-distributed constant line which has characteristic impedance $Z_g$. Also, source-drain capacitance $C_{ds}$ of each FET 45 and distributed constant line 44 adjacent thereto form a pseudo-distributed constant line.

Next, a description will be given of the operation of the distributed amplifier shown in FIG. 1.

A signal applied from input terminal 41 propagates through a plurality of distributed constant lines 43 toward input side termination resistor 46. Most of the propagating signal is distributed to each FET 45 in sequence, and amplified therein.

On the other hand, useless signal which has not been distributed to any of FETs 45 are absorbed by input side termination resistor 46. In this way, input side coupling circuit 47 in such a configuration generally exhibits a good input reflection characteristic over a wide band, without using a matching circuit.

On the other hand, the signal applied to each FET 45 is amplified in accordance with the gate width of each FET 45. The signal amplified by each FET 45 propagates toward output terminal 42 through a plurality of distributed constant lines 44 in output side coupling circuit 49, and is sequentially combined and delivered from output terminal 42. Each of propagation paths from input terminal 41 to output terminal 42 is configured to have an electric length equal to each other. Such output side coupling circuit 49 exhibits a good reflection characteristic over a wide band without using a matching circuit in a configuration similar to input side coupling circuit 47.

Figure 2:
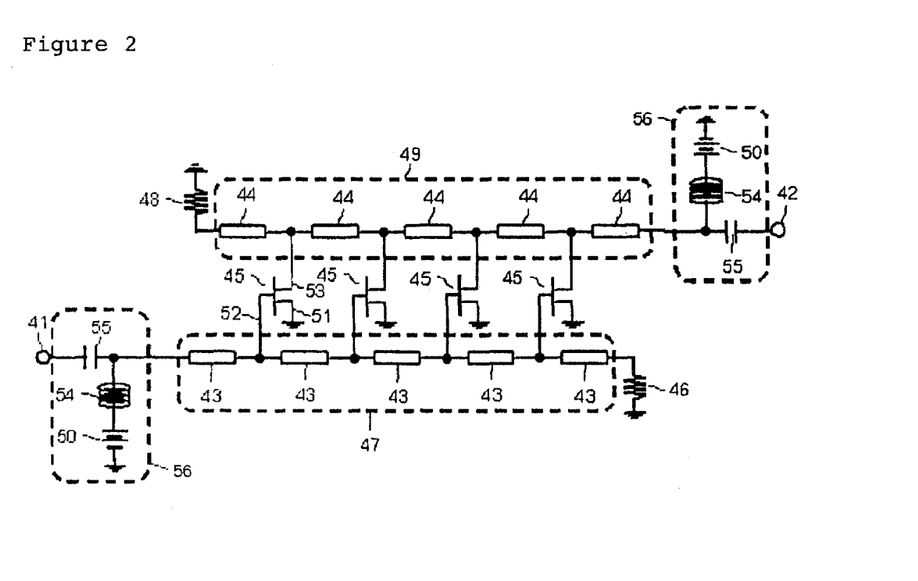

In the distributed amplifier as described above, a bias tee is generally used as a circuit for applying a bias to each FET 45. FIG. 2 is a circuit diagram showing an exemplary circuit configuration which employs a bias tee in the distributed amplifier of FIG. 1. Referring to FIG. 2, bias tee 56 comprising inductor 54 and capacitor 55 is used for each of input terminal 41 and output terminal 42.

DISCLOSURE OF THE INVENTION

A bias circuit used in a wide band distribution amplifier must exhibit good characteristics in which the band frequency ranges from several tens of kHz to several tens of GHz. The bias tee shown in FIG. 2 is required to exhibit good characteristics in which band frequency ranges from several tens of kHz to several tens of GHz. In order to make the impedance of the bias circuit appear high in a frequency band of several tens of GHz, inductor 54 with a large inductance is required. Also, in order to be able to ignore the impedance of the capacitor even in a frequency band of several tens of kHz, capacitor 55 that has a large capacitance is required. This results in a larger size of bias tee 56 which experiences the problem in which it is difficult for it to be built into the integrated circuit of the distributed amplifier.

Figure 3:
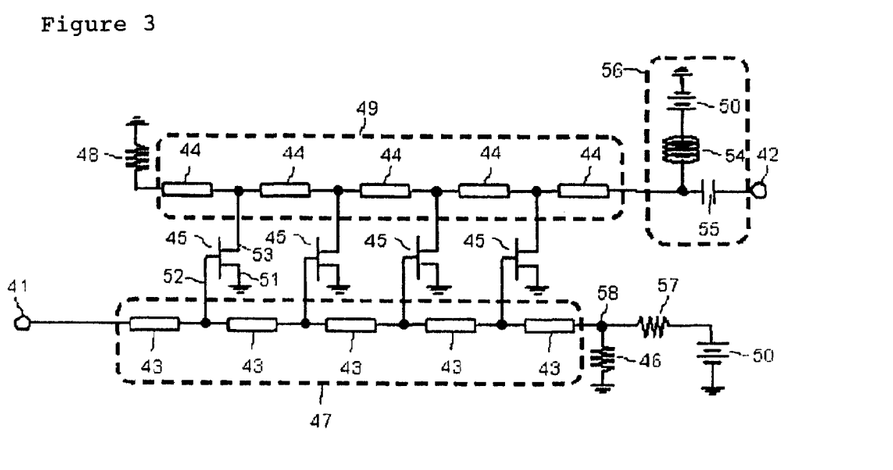

FIG. 3 is a circuit diagram showing an exemplary configuration which employs a bias circuit different from that of FIG. 2 on the input side of the distributed amplifier of FIG. 1. Referring to FIG. 3, in addition to input side termination resistor 46, a circuit having resistor 57 and regulated voltage source 50 connected in series is connected between bias input terminal 58 and a ground potential as an input side bias circuit. Resistor 57 has a resistance value as large as several $\Omega k$ such that the input impedance does not vary depending on the frequency. In this way, an input side bias circuit can be realized without affecting the characteristics of the distributed amplifier.

This bias circuit can be applied to the case of input terminal 41 of the FET-based distributed amplifier shown in FIG. 1 in which a gate current hardly flows. However, when a current flows through the bias circuit as output terminal 42, a voltage drop is produced by the large resistor connected in series with the regulated voltage source, so that a regulated voltage source is required for a largely higher voltage than that in order to apply a desired bias to the bias input terminal, which is not practical.

It is an object of the present invention to provide a distributed amplifier which is capable of exhibiting a flat gain characteristic over a wide band without using a large bias tee.

To achieve the above object, the distributed amplifier of the present invention is a distributed amplifier for amplifying a signal which is applied to an input terminal and which includes components in a predetermined frequency range and delivering from an output terminal, and comprising a plurality of transistors, an input side coupling circuit, an output side coupling circuit, and a termination circuit.

The plurality of transistors operate as amplification elements.

The input side coupling circuit includes a plurality of distributed constant lines connected in series, one terminal which is the input terminal, and another terminal which is a bias input terminal, wherein each of the connections of the distributed constant lines, which are connected to each other, is connected to an input of each of the plurality of transistors.

The output side coupling circuit includes a plurality of distributed constant lines connected in series, one terminal which is the output terminal, and another terminal which is a bias input terminal, wherein each of connections of the distributed constant lines, which are connected to each other, is connected to an output of each of the plurality of transistors.

The termination circuit is contained in one or more input side coupling circuit and one or more output side coupling circuits. The termination circuit includes a first resistor connected between the bias input terminal and a voltage source, and a second resistor connected between the bias input terminal and a ground potential. The first resistor has a resistance value equal to or smaller than the resistance value of the second resistor.

Thus, according to the present invention, since the input impedance of the termination circuit is determined as a parallel circuit of the first resistor and second resistor, a flat characteristic is demonstrated over a wide band independently of the frequency. Also, since the first resistor is equal to or smaller than the second resistor, the potential of the voltage source need not be largely increased beyond the potential of the bias input terminal. It is therefore possible to provide a flat gain characteristic over a wide band without using a large-sized bias tee.

BRIEF DESCRIPTION OF THE DRAWINGS

FIG. 1

A circuit diagram showing an exemplary configuration of a distributed amplifier.

FIG. 2

A circuit diagram showing an exemplary circuit configuration using a bias tee in the distributed amplifier of FIG. 1.

FIG. 3

A circuit diagram showing an exemplary configuration using a bias circuit different from that of FIG. 6 on the input side of the distributed amplifier of FIG. 1.

FIG. 4

A circuit diagram showing the configuration of a distributed amplifier according to a first embodiment.

FIG. 5

A graph showing the frequency characteristic of the gain of the distributed amplifier according to the first embodiment.

FIG. 6

A circuit diagram showing the configuration of a distributed amplifier according to a second embodiment.

FIG. 7

A circuit diagram showing the configuration of a distributed amplifier according to a third embodiment.

BEST MODE FOR CARRYING OUT THE INVENTION

Modes for carrying out the invention will be described in detail with reference to the drawings.

First Embodiment

Figure 4:
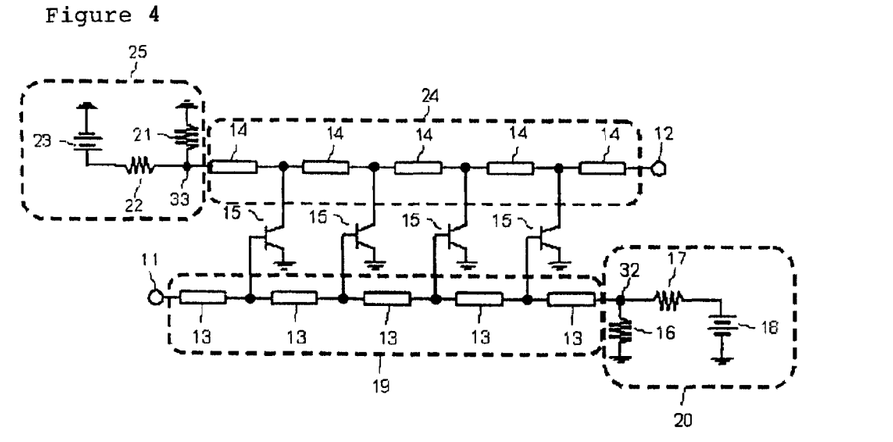

FIG. 4 is a circuit diagram showing the configuration of a distributed amplifier according to a first embodiment. Shown herein is, by way of example, a distributed amplifier which employs an emitter grounded bipolar transistor as a unit amplifier circuit, and comprises four stages of the unit amplifier circuits.

Referring to FIG. 4, the distributed amplifier of the first embodiment comprises a plurality of bipolar transistors 15 (here, four), an input side coupling circuit 19, an input side termination circuit 20, an output side coupling circuit 24, and an output side termination circuit 25.

Input side coupling circuit 19 comprises a plurality of distributed constant lines 13 connected in series. Output side coupling circuit 24 comprises a plurality of distributed constant lines 14 connected in series.

Input side termination circuit 20 comprises input side termination resistor 16, resistor 17, and voltage source 18. Output side termination circuit 25 comprises output side termination resistor 21, resistor 22, and voltage source 23.

One terminal of input side coupling circuit 19 is input terminal 11, and the other input terminal is input side bias input terminal 32 connected to input side termination circuit 20. Then, an input terminal of each of a plurality of bipolar transistors 15 is connected to each connection of distributed constant lines 13, which are connected to each other, in input side coupling circuit 19.

An output terminal of each of a plurality of bipolar transistors 15 is connected to each connection of distributed constant lines 14, which are connected to each other, in output side coupling circuit 24. Then, a terminal further away from input terminal 11 of output side coupling circuit 24 is output terminal 12, and the other terminal is output side bias input terminal 33 that is connected to output side termination circuit 25.

In input side termination circuit 20, one terminal of input side termination resistor 16 and one terminal of resistor 17 are connected to input side bias input terminal 32. The other terminal of input side termination resistor 16 is grounded. Also, the other terminal of resistor 17 is connected to voltage source 18 for applying a bias.

In output side termination circuit 25, one terminal of output side termination resistor 21 and one terminal of resistor 22 are connected to output side bias input terminal 33. The other terminal of output side termination resistor 21 is grounded. Also, the other terminal of resistor 22 is connected to voltage source 23 for applying a bias.

In such a distributed amplifier, distributed constant line 13 and a capacitance between base and emitter of bipolar transistor 15 adjacent thereto form an input side pseudo-distributed constant line (single line). Also, a collector-emitter capacitance of each bipolar transistor 15 and distributed constant line 14 adjacent thereto form an output side pseudo-distributed constant line (single line).

Input terminal 11 and output terminal 12 have an external impedance of 50Ω. Also, an inductive component of the single line of the input side pseudo-distributed constant transmission line is $L_{in}$, and a capacitive component of the same is $C_{in}$. An inductive component of the single line of the output side pseudo-distributed constant transmission line is $L_{out}$, and a capacitive component of the same is $C_{out}$.

Preferably, the relationships represented by Equations (1), (2) are substantially established in order that an input signal to input terminal 11 is distributed to the base of each bipolar transistor 15 in input side coupling circuit 19, amplified by each bipolar transistor 15, and combined in sequence by output side coupling circuit 24.

[Expression 1]

$$\sqrt{L_{in}C_{in}} = \sqrt{L_{out}C_{out}} \quad (1)$$

$$\sqrt{\frac{L_{in}}{C_{in}}} = \sqrt{\frac{L_{out}}{C_{out}}} = 50\ \Omega \quad (2)$$

Also, the input impedance of input side termination circuit 20 is set to 50Ω such that it is equal to the external impedance of input terminal 11. The input impedance of output side termination circuit 25 is set to 50Ω such that it is equal to the external impedance of output terminal 12.

Since the input impedance of regulated voltage source 18 for applying a bias voltage to input side bias input terminal 32 on the input side can be assumed to be 0Ω, the input impedance of input side termination circuit 20 is a parallel circuit of input side termination resistor 16 and resistor 17. The impedance of this parallel circuit does not vary with respect to the frequency.

Also, when the resistance value of resistor 17 is $R_{in1}$, and the resistance value of input side termination resistor 16 is $R_{in2}$, $R_{in1}$ and $R_{in2}$ are defined to satisfy the condition of Equation (3). In this way, when a current flows into bias input terminal 32, no large voltage drop will occur at resistor 17.

[Expression 2]

$$R_{in1} \leq R_{in2} \quad (3)$$

Similarly, since the input impedance of regulated voltage source 23 for applying a bias voltage to output side bias input terminal 33 on the output side can be assumed to be 0Ω, the input impedance of output side termination circuit 25 is a parallel circuit of output side termination resistor 21 and resistor 22. Then, when the resistance value of resistor 22 is Rout1, and the resistance value of output side termination resistor 21 is Rout2, Rout1 and Rout2 are defined to satisfy the condition of Equation (4).

[Expression 3]

$$R_{out1} \leq R_{out2} \quad (4)$$

As a specific example, input side termination resistor 16 and resistor 17 as well as output side termination resistor 21, and resistor 22 may all be set to 100Ω.

Also, since a current flows from regulated voltage source 18 into input side termination resistor 16 on the input side, the voltage of regulated voltage source 18 is set such that input side bias input terminal 33 can be applied with a desired bias by a parallel circuit of input side termination resistor 16 and resistor 17 which satisfies the condition of Equation (3).

Since a current flows from regulated voltage source 23 into output side termination resistor 21 on the output side, as well, in a manner similar to the input side, the voltage of regulated voltage source 23 is set such that output side bias input terminal 32 can be applied with a desired bias by a parallel circuit of output side termination resistor 21 and resistor 22 which satisfies the condition of Equation (4).

According to this embodiment, since input side termination circuit 20 exhibits a flat characteristic for a wide band independently of the frequency because the input impedance is defined as a parallel circuit of resistors 16, 17, and because resistor 17 is equal to or smaller than termination resistor 16, it is not necessary to largely increase the potential of regulated voltage source 18 beyond bias input terminal 32. According to the distributed amplifier of this embodiment, a flat gain characteristic (for example, within approximately 3 dB) can be provided over a wide range without using a large bias tee. Also, because of the configuration which comprises a small termination circuit comprised of resistors 16, 17 instead of a conventional large-sized bias tee, the termination circuit may be built in an integrated circuit of the distributed amplifier. In this way, a reduction in size and cost can be accomplished for a device which comprises the distributed amplifier.

In this regard, as long as the gain and reflection characteristic satisfy predetermined required conditions, it is not essential that the input impedance of input side termination circuit 20 matches the characteristic impedance of distributed constant line 13 on the input side, and they may not match.

According to this embodiment, since output side termination circuit 25 exhibits a flat characteristic for a wide band independently of the frequency because the input impedance is defined as a parallel circuit of resistors 21, 22, and because resistor 22 is equal to or smaller than termination resistor 21, it is not necessary to largely increase the potential of regulated voltage source 23 beyond bias input terminal 33. According to the distributed amplifier of this embodiment, a flat gain characteristic (for example, within approximately 3 dB) can be provided over a wide range without using a large bias tee. Also, because of the configuration which comprises a small termination circuit comprised of resistors 21, 22 instead of a conventional large-sized bias tee, the termination circuit may be built in an integrated circuit of the distributed amplifier. In this way, a reduction in size and cost can be accomplished for a device which comprises the distributed amplifier.

In this regard, as long as the gain and reflection characteristic satisfy predetermined required conditions, it is not essential that the input impedance of output side termination circuit 25 matches the characteristic impedance of distributed constant line 14, and they may not match.

Figure 5:
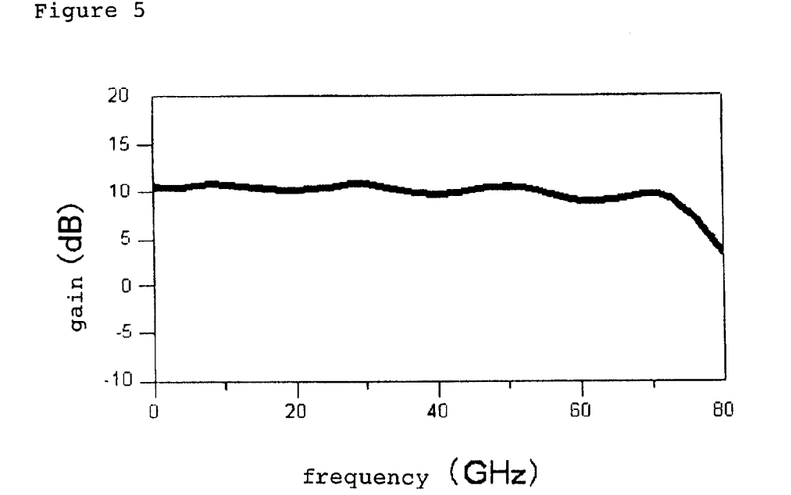

FIG. 5 is a graph showing the frequency characteristic of the gain of the distributed amplifier according to the first embodiment. Referring to FIG. 5, according to the distributed amplifier of the first embodiment, a flat gain characteristic (here within 3 dB) is exhibited in a wide band from 30 kHz to 70 GHz.

While in this embodiment, a description has been given of the distributed amplifier which comprises a plurality of emitter grounded transistors 15, the present invention is not limited to this. As another example, a distributed amplifier in a cascode configuration with an emitter grounded transistor connected to a base grounded transistor can be realized in a similar manner.

Also, while in this embodiment, a semiconductor integrated circuit using bipolar transistors has been illustrated, the present invention is not limited to this. As another example, a distributed amplifier using other devices such as FET, MOS and the like can be configured in a similar manner.

Also, in this embodiment, the input impedance of input side termination circuit 20 is set to 50Ω such that it is equal to the external impedance of input terminal 11, but they may not be necessarily equal. The input impedance of input side termination circuit 20 is determined by a desired gain and reflection characteristic.

Similarly, in this embodiment, the input impedance of output side termination circuit 25 is set to 50Ω such that it is equal to the external impedance of output terminal 12, but they may not be necessarily equal. The input impedance of output side termination circuit 25 is determined by a desired gain and reflection characteristic.

Also, while this embodiment comprises the termination circuits in the same configuration in both the input side and output side, the present invention is not limited to this. Resistors having different resistance values may be used on the input side and output side. Alternatively, the termination circuit of this embodiment may be used only on one side. In this event, a termination circuit of a second or a third embodiment, later described, may be used on the other side. Alternatively, the bias circuit shown in FIG. 3, for example, may be used on the input side of a distributed amplifier comprised of FETs, into which a current hardly flows, while the termination circuit of this embodiment may be used only on the output side.

Second Embodiment

Figure 6:
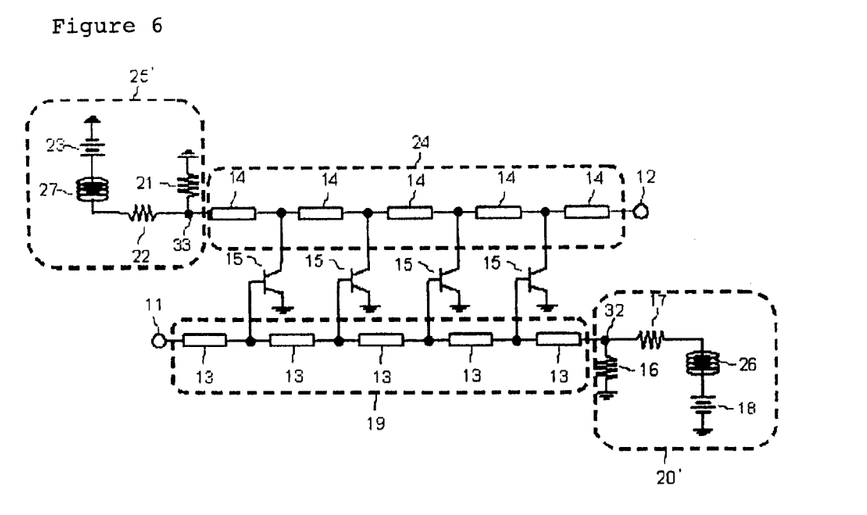

FIG. 6 is a circuit diagram showing the configuration of a distributed amplifier according to a second embodiment. Shown herein is, by way of example, a distributed amplifier which employs an emitter grounded bipolar transistor as a unit amplifier circuit, and comprises four stages of the unit amplifier circuits.

Referring to FIG. 6, the distributed amplifier of the second embodiment comprises, like the first embodiment, a plurality (four) of bipolar transistors 15, input side coupling circuit 19, input side termination circuit 20', output side coupling circuit 24, and output side termination circuit 25'. The second embodiment differs from the first embodiment in the configuration of input side termination circuit 20' and output side termination circuit 25'.

Input side coupling circuit 19 comprises a plurality of distributed constant lines 13 connected in series. Output side coupling circuit 24 comprises a plurality of distributed constant lines 14 connected in series.

Input side termination circuit 20' comprises input side termination resistor 16, resistor 17, inductor 26, and voltage source 18. Output side termination circuit 25' comprises output side termination resistor 21, resistor 22, inductor 27, and voltage source 23.

One terminal of input side coupling circuit 19 is input terminal 11, and the other terminal is input side bias input terminal 32 connected to input side termination circuit 20'. Then, an input terminal of each of a plurality of bipolar transistors 15 is connected to each connection of distributed constant lines 13, which are connected to each other, in input side coupling circuit 19.

An output terminal of each of a plurality of bipolar transistors 15 is connected to each connection of distributed constant lines 14, which are connected to each other, in output side coupling circuit 24. Then, a terminal further away from input terminal 41 of output side coupling circuit 24 is output terminal 12, and the other terminal is output side bias input terminal 33 connected to output side termination circuit 25'.

In input side termination circuit 20', one terminal of input side termination resistor 16 and one terminal of resistor 17 are connected to input side bias input terminal 32. The other terminal of input side termination resistor 16 is grounded. Also, the other terminal of resistor 17 is connected to one terminal of inductor 26, and the other terminal of inductor 26 is connected to voltage source 18.

In output side termination circuit 25', one terminal of output side termination resistor 21 and one terminal of resistor 22 are connected to output side bias input terminal 33. The other terminal of output side termination resistor 21 is grounded. Also, the other terminal of resistor 22 is connected to one terminal of inductor 27, and the other terminal of inductor 27 is connected to voltage source 23.

In such a distributed amplifier, distributed constant line 13 and a capacitance between the base and emitter of bipolar transistor 15 adjacent thereto form an input side pseudo-distributed constant line (single line). Also, a collector-emitter capacitance of each bipolar transistor 15 and distributed constant line 14 adjacent thereto form an output side pseudo-distributed constant line (single line).

The input impedances of input side termination circuit 20' and output side termination circuit 25' are $Z_0$. Also, an inductive component of the single line of the input side pseudo-distributed constant transmission line is $L_{in}$, and a capacitive component of the same is $C_{in}$. An inductive component of the single line of the output side pseudo-distributed constant transmission line is $L_{out}$, and a capacitive component of the same is $C_{out}$.

Preferably, the relationships represented by Equations (5), (6) are substantially established in order that an input signal to input terminal 11 is distributed to the base of each bipolar transistor 15 in input side coupling circuit 19, is amplified by each bipolar transistor 15, and is combined in sequence by output side coupling circuit 24.

[Expression 4]

$$\sqrt{L_{in}C_{in}} = \sqrt{L_{out}C_{out}} \quad (5)$$

$$\sqrt{\frac{L_{in}}{C_{in}}} = \sqrt{\frac{L_{out}}{C_{out}}} = Z_0 \quad (6)$$

Also, since the input impedance of regulated voltage source 18 for applying a bias voltage to input side bias input terminal 32 on the input side can be assumed to be 0Ω, the input impedance of input side termination circuit 20' is a parallel circuit of input side termination resistor 16 and a series connection of resistor 17 and inductor 26. Then, input impedance $Z_0$ can be represented by $R_1$, $R_2$, L, as in Equation (7):

[Expression 5]

$$Z_0 = \frac{R_2(R_1 + j\omega L)}{R_1 + R_2 + j\omega L} \quad (7)$$

where $R_1$ is the resistance value of resistor 17, $R_2$ is the resistance value of input side termination resistor 16, and L is the inductance of inductor 26.

Here, the gain and reflection characteristic of the distributed amplifier of this embodiment must take values within good predetermined ranges in a desired frequency range. The desired frequency range is determined by required conditions in a system to which the distributed amplifier is applied, and in this embodiment, is a range of values from 30 kHz to 50 GHz or more, by way of example. On the other hand, the ranges of the good gain and reflection characteristic are determined by required conditions such as to which degree the gain and its flatness are required, and the like. In this embodiment, the values of $R_1$, $R_2$, and L are selected such that input impedance $Z_0$ represented by Equation (7) falls within a predetermined range in a desired frequency range.

Also, $R_1$ and $R_2$ are determined to satisfy the condition of Equation (8) such that the potential of regulated voltage source 18 will not largely increase beyond bias input terminal 32.

[Expression 6]

$$R_1 \leq R_2 \quad (8)$$

In this embodiment, the values of $R_1$, $R_2$, L are selected to satisfy Equations (5)-(8) substantially (within a predetermined range) within a predetermined frequency range (from 30 kHz to 50 GHz).

Also, the output side can be considered in a similar manner to the input side, and the input impedance of output side termination circuit 25' is a parallel circuit of output side termination resistor 21 and a serial connection of resistor 22 and inductor 27. Then, when the resistance value of resistor 22 is $R_1$, the resistance value of input side termination resistor 21 is $R_2$, and the inductance of inductor 26 is L, input impedance $Z_0$ is represented by $R_1$, $R_2$, L as in Equation (7).

In this embodiment, as a specific example, inductance L of inductors 26, 27 is 0.2 nH that is an inductance value of a bonding wire, resistance value $R_2$ of termination resistors 16, 21 is 110Ω, and resistance value R1 of resistors 17, 22 is 90Ω. Also, as an example, input side regulated voltage source 18 is 1.8 V, and output side regulated voltage source 23 is 3 V in order to apply desired biases to bias input terminals 32, 33.

According to this embodiment, since input side termination circuit 20' and output side termination circuit 25' have resistors 17, 16, 22, 21, the resistance values of which are selected such that resistors 17, 22 are equal to or smaller than termination resistors 16, 21, the potentials of regulated voltage sources 18, 23 need not be largely increased beyond bias input terminal 32. Also, since input side termination circuit 20' and output side termination circuit 25' have the resistance values of resistors 17, 16, 22, 21 and the inductance of inductors 26, 27 selected such that the input impedance is represented by Equation (7) and the gain varies within a predetermined range in a desired frequency range, a flat characteristic is exhibited over a desired wide band. As a result, according to the distributed amplifier of this embodiment, a flat gain characteristic can be provided over a desired wide range without using a large-sized bias tee.

While in this embodiment, a description has been given of the distributed amplifier which comprises a plurality of emitter grounded transistors 15, the present invention is not limited to this. As another example, a distributed amplifier in a cascode configuration with an emitter grounded transistor connected to a base grounded transistor can be realized in a similar manner.

Also, while in this embodiment, a semiconductor integrated circuit using bipolar transistors has been illustrated, the present invention is not limited to this. As another example, a distributed amplifier using other devices such as FET, MOS and the like can be configured in a similar manner.

Third Embodiment

Figure 7:
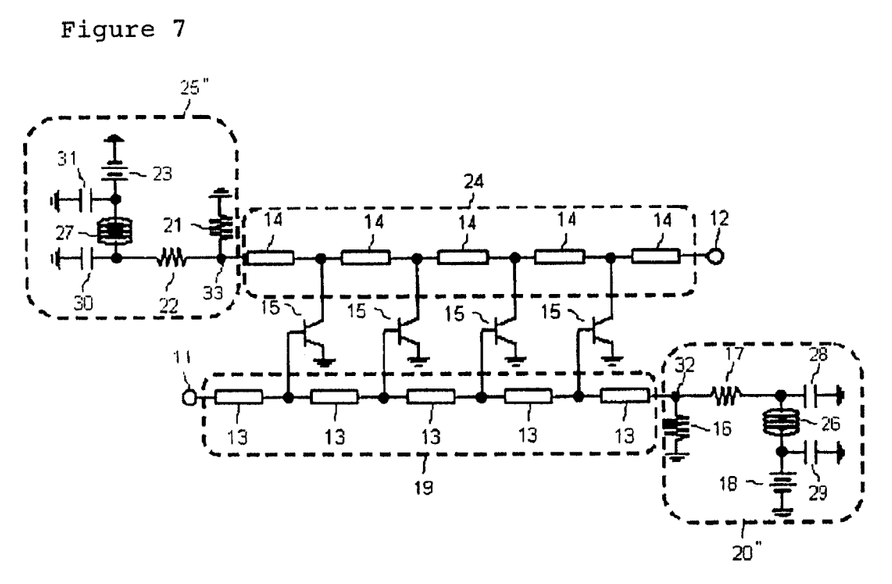

FIG. 7 is a circuit diagram showing the configuration of a distributed amplifier according to a third embodiment. Shown herein, by way of example is, a distributed amplifier which employs an emitter grounded bipolar transistor as a unit amplifier circuit, and comprises four stages of the unit amplifier circuits.

Referring to FIG. 7, the distributed amplifier of the third embodiment comprises, like the first embodiment, a plurality (four) of bipolar transistors 15, input side coupling circuit 19, input side termination circuit 20", output side coupling circuit 24, and output side termination circuit 25". The third embodiment differs from the first embodiment in the configuration of input side termination circuit 20" and output side termination circuit 25".

Input side coupling circuit 19 comprises a plurality of distributed constant lines 13 connected in series. Output side coupling circuit 24 comprises a plurality of distributed constant lines 14 connected in series.

Input side termination circuit 20" comprises input side termination resistor 16, resistor 17, inductor 26, and voltage source 18. Output side termination circuit 25" comprises output side termination resistor 21, resistor 22, inductor 27, and voltage source 23.

One terminal of input side coupling circuit 19 is input terminal 11, and the other terminal is input side bias input terminal 32 connected to input side termination circuit 20". Then, an input terminal of each of a plurality of bipolar transistors 15 is connected to each connection of distributed constant lines 13, which are connected to each other, in input side coupling circuit 19.

An output terminal of each of a plurality of bipolar transistors 15 is connected to each connection of distributed constant lines 14, which are connected to each other, in output side coupling circuit 24. Then, a terminal further away from input terminal 41 of output side coupling circuit 24 is output terminal 12, and the other terminal is output side bias input terminal 33 connected to output side termination circuit 25".

In input side termination circuit 20", one terminal of input side termination resistor 26 and one terminal of resistor 17 are connected to input side bias input terminal 32. The other terminal of input side termination resistor 16 is grounded. Also, the other terminal of resistor 17 is connected to one terminal of inductor 26 and one terminal of ground capacitor 28. The other terminal of inductor 26 is connected to regulated voltage source 18 and one terminal of ground capacitor 29. The other terminals of ground capacitors 28, 29 are grounded.

In output side termination circuit 25", one terminal of output side termination resistor 21 and one terminal of resistor 22 are connected to output side bias input terminal 33. The other terminal of output side termination resistor 21 is grounded. Also, the other terminal of resistor 22 is connected to one terminal of inductor 27 and to one terminal of ground capacitor 30. The other terminal of inductor 27 is connected to regulated voltage source 23 and to one terminal of ground capacitor 31. The other terminals of ground capacitors 30, 31 are grounded.

In such a distributed amplifier, distributed constant line 13 and a capacitance between the base and emitter of bipolar transistor adjacent thereto form an input side pseudo-distributed constant line (single line). Also, a collector-emitter capacitance of each bipolar transistor 15 and distributed constant line 14 adjacent thereto form an output side pseudo-distributed constant line (single line).

The input impedances of input side termination circuit 20" and output side termination circuit 25" are $Z_0$. Also, an inductive component of the single line of the input side pseudo-distributed constant transmission line is $L_{in}$, and a capacitive component of the same is $C_{in}$. An inductive component of the single line of the output side pseudo-distributed constant transmission line is $L_{out}$, and a capacitive component of the same is $C_{out}$.

Preferably, the relationships represented by the aforementioned Equations (5), (6) are substantially established in order that an input signal to input terminal 11 is distributed to the base of each bipolar transistor 15 in input side coupling circuit 19, is amplified by each bipolar transistor 15, and is combined in sequence by output side coupling circuit 24.

Also, since the input impedance of regulated voltage source 18 for applying a bias voltage to input side bias input terminal 32 on the input side can be assumed to be 0Ω, the input impedance of input side termination circuit 20" is a parallel circuit of input side termination resistor 16 and a series connection of inductor 26 having ground capacitor 28 on one terminal and ground capacitor 29 on the other terminal and resistor 17. Then, input impedance $Z_0$ can be represented by $R_1$, $R_2$, L, $C_1$, $C_2$ as in Equation (9):

[Expression 7]

$$Z_0 = \frac{R_2\left(R_1 + \frac{\left(j\omega L + \frac{1}{j\omega C_2}\right)\frac{1}{j\omega C_1}}{j\omega L + \frac{1}{j\omega C_2} + \frac{1}{j\omega C_1}}\right)}{R_1 + R_2 + \frac{\left(j\omega L + \frac{1}{j\omega C_2}\right)\frac{1}{j\omega C_1}}{j\omega L + \frac{1}{j\omega C_2} + \frac{1}{j\omega C_1}}} \quad (9)$$

where $R_1$ is the resistance value of resistor 17, $R_2$ is the resistance value of input side termination resistor 16, L is the inductance of inductor 26, $C_1$ is the capacitance of ground capacitor 28, and $C_2$ is the capacitance of ground capacitor 29.

Here, the gain and reflection characteristic of the distributed amplifier of this embodiment must take values within good predetermined range in a desired frequency range. The desired frequency range is determined by required conditions in a system to which the distributed amplifier is applied, and in this embodiment, the desired frequency range is a range of values from 30 kHz to 50 GHz or more, by way of example. On the other hand, the ranges of the good gain and reflection characteristic are determined by the required conditions such as to which degree the gain and its flatness are required, and the like. In this embodiment, the values of $R_1$, $R_2$, L, $C_1$ and $C_2$ are selected such that input impedance $Z_0$ represented by Equation (9) falls within a predetermined range in a desired frequency range.

Also, $R_1$ and $R_2$ are determined to satisfy the condition of the aforementioned Equation (8) such that the potential of regulated voltage source 18 will not largely increase beyond bias input terminal 32.

For this reason, in this embodiment, the values of $R_1$, $R_2$, L, $C_1$, $C_2$ are selected to satisfy Equations (5), (6), (9), (8) substantially (within a predetermined range) within a predetermined frequency range (from 30 kHz to 50 GHz).

Also, the output side can be considered in a similar manner to the input side, and the input impedance of output side termination circuit 25" is a parallel circuit of output side termination resistor 21 and a serial connection of inductor 27 having ground capacitor 30 on one terminal and ground capacitor 31 on the other terminal and resistor 22. Then, when the resistance value of resistor 22 is $R_1$, the resistance value of input side termination resistor 21 is $R_2$, the inductance of inductor 26 is L, the capacitance of ground capacitor 30 is $C_1$, and the capacitance of ground capacitor 31 is $C_2$, input impedance $Z_0$ is represented by $R_1$, $R_2$, L, $C_1$, $C_2$ as in Equation (9).

In this embodiment, as a specific example, inductance L of inductors 26, 27 is 0.2 nH that is an inductance value of a bonding wire, resistance value $R_2$ of termination resistors 16, 21 is 110Ω, resistance value R1 of resistors 17, 22 is 90Ω, the capacitance of ground capacitors 28, 30 is 1 pF, and the capacitance of ground capacitors 29, 31 is 50 pF. Ground capacitors 28, 30 in front of inductors 26, 27 act to restrain variations in inductance of the bonding wires, while ground capacitors 29, 31 behind inductors 26, 27 act to restrain variations in regulated voltage sources 18, 23. Also, as an example, input side regulated voltage source 18 is 1.8V, and output side regulated voltage source 23 is 3 V so as to apply desired biases to bias input terminals 32, 33.

According to this embodiment, since input side termination circuit 20" and output side termination circuit 25" have resistors 17, 16, 22, 21, the resistance values of which are selected such that resistors 17, 22 are equal to or smaller than termination resistors 16, 21, the potentials of regulated voltage sources 18, 23 need not be largely increased beyond bias input terminal 32. Also, since input side termination circuit 20" and output side termination circuit 25" have the resistance values of resistors 17, 16, 22, 21, the inductance of inductors 26, 27, and the capacitance of capacitors 28, 29, 30, 31 selected such that the input impedance is represented by Equation (9) and the gain varies within a predetermined range in a desired frequency range, a flat characteristic is exhibited over a desired wide band. As a result, according to the distributed amplifier of this embodiment, a flat gain characteristic can be provided over a desired wide range without using a large-sized bias tee.

While in this embodiment, a description has been given of the distributed amplifier which comprises a plurality of emitter grounded transistors 15, the present invention is not limited to this. As another example, a distributed amplifier in a cascode configuration with an emitter grounded transistor connected to a base grounded transistor can be realized in a similar manner.

Also, while in this embodiment, a semiconductor integrated circuit using bipolar transistors has been illustrated, the present invention is not limited to this. As another example, a distributed amplifier using other devices such as FET, MOS and the like can be configured in a similar manner.

The invention claimed is:

1. A distributed amplifier for amplifying a signal applied to an input terminal and including components in a predetermined frequency range to deliver the amplified signal from an output terminal, said distributed amplifier comprising:
    a plurality of transistors which operate as amplification elements;
    an input side coupling circuit including a plurality of distributed constant lines connected in series, one terminal of which is the input terminal, and another terminal of which is a bias input terminal, wherein each of the connections of said distributed constant lines with each other is connected to an input of each of said plurality of transistors;
    an output side coupling circuit including a plurality of distributed constant lines connected in series, one terminal of which is the output terminal, and another terminal of which is a bias input terminal, wherein each of the connections of said distributed constant lines with each other is connected to an output of each of said plurality of transistors; and
    a termination circuit contained in at least one of said input side coupling circuit and said output side coupling circuit, including an inductor connected to a voltage source, a first resistor connected between the bias input terminal and the inductor, and a second resistor connected between the bias input terminal and a ground potential, wherein said first resistor has a resistance value equal to or smaller than a resistance value of said second resistor, and the resistance value of said first resistor, the resistance value of said second resistor, and an inductance value of said inductor are selected, such that an impedance of an equivalent circuit which has a series connected circuit of said first resistor and said inductor and has said second resistor connected in parallel with said series connected circuit, has an impedance value within a predetermined range in the predetermined frequency range.

2. A distributed amplifier for amplifying a signal applied to an input terminal and including components in a predetermined frequency range to deliver the amplified signal from an output terminal, said distributed amplifier comprising:

a plurality of transistors which operate as amplification elements;

an input side coupling circuit including a plurality of distributed constant lines connected in series, one terminal of which is the input terminal, and another terminal of which is a bias input terminal, wherein each of the connections of said distributed constant lines with each other is connected to an input of each of said plurality of transistors;

an output side coupling circuit including a plurality of distributed constant lines connected in series, one terminal of which is the output terminal, and another terminal of which is a bias input terminal, wherein each of the connections of said distributed constant lines with each other is connected to an output of each of said plurality of transistors; and a termination circuit contained in at least one of said input side coupling circuit and said output side coupling circuit, including a first resistor connected between the bias input terminal and a voltage source, and a second resistor connected between the bias input terminal and a ground potential, wherein said first resistor has a resistance value equal to or smaller than a resistance value of said second resistor, said termination circuit further includes an inductor connected between said first resistor and said voltage source, a first capacitor connected between a connection point of said first resistor and said inductor and the ground potential point, and a second capacitor connected between a connection point of said inductor and said voltage source and the ground potential point, and the resistance value of said first resistor, the resistance value of said second resistor, the inductance of said inductor, the capacitance of said first capacitor, and the capacitance of said second capacitor are selected such that the impedance of an equivalent circuit, in which said inductor and said second capacitor are connected in series, the series circuit and said first capacitor are connected in parallel, the parallel circuit and said first resistor are connected in series, and said second resistor is connected in parallel with the circuit, has a value within a predetermined range in the predetermined frequency range.

3. The distributed amplifier according to claim 1, wherein:

said termination circuit is provided in both of said input side coupling circuit and said output side coupling circuit, and $\sqrt{(L_{in} \cdot C_{in})} = \sqrt{(L_{out} \cdot C_{out})}$ and $\sqrt{(L_{in}/C_{in})} = \sqrt{(L_{out}/C_{out})}$ are established, where $C_{in}$ is the capacitance of a single input side pseudo-distributed constant line formed of said distributed constant line of said input side coupling circuit and a transistor adjacent to said distributed constant line, $L_{in}$ is the inductance of the single input side pseudo-distributed constant line, $C_{out}$ is the capacitance of a single output side pseudo-distributed constant line formed of said distributed constant line of said output side coupling circuit and a transistor adjacent to said distributed constant line, and $L_{out}$ is the inductance of the single output side pseudo-distributed constant line.

4. The distributed amplifier according to claim 1, wherein the value of $\sqrt{(L_{in}/C_{in})}$ and $\sqrt{(L_{out}/C_{out})}$ is substantially equal to the impedance of said equivalent circuit of said termination circuit in the predetermined frequency range.

5. The distributed amplifier according to claim 1, wherein said predetermined frequency range includes at least a range from 30 kHz to 50 GHz.

6. An integrated circuit having the distributed amplifier according to claim 1, built therein.

7. The distributed amplifier according to claim 2, wherein:

said termination circuit is provided in both of said input side coupling circuit and said output side coupling circuit, and $\sqrt{(L_{in} \cdot C_{in})} = \sqrt{(L_{out} \cdot C_{out})}$ and $\sqrt{(L_{in}/C_{in})} = \sqrt{(L_{out}/C_{out})}$ are established, where $C_{in}$ is the capacitance of a single input side pseudo-distributed constant line formed of said distributed constant line of said input side coupling circuit and a transistor adjacent to said distributed constant line, $L_{in}$ is the inductance of the single input side pseudo-distributed constant line, $C_{out}$ is the capacitance of a single output side pseudo-distributed constant line formed of said distributed constant line of said output side coupling circuit and a transistor adjacent to said distributed constant line, and $L_{out}$ is the inductance of the single output side pseudo-distributed constant line.

8. The distributed amplifier according to claim 7, wherein the value of $\sqrt{(L_{in}/C_{in})}$ and $\sqrt{(L_{out}/C_{out})}$ is substantially equal to the impedance of said equivalent circuit of said termination circuit in the predetermined frequency range.

9. The distributed amplifier according to claim 3, wherein said predetermined frequency range includes at least a range from 30 kHz to 50 GHz.

10. An integrated circuit having the distributed amplifier according to claim 2 built therein.

* * * * *

UNITED STATES PATENT AND TRADEMARK OFFICE
CERTIFICATE OF CORRECTION

| | | |
|---|---|---|
| PATENT NO. | : 7,733,185 B2 | Page 1 of 1 |
| APPLICATION NO. | : 12/089862 | |
| DATED | : June 8, 2010 | |
| INVENTOR(S) | : Yasuyuki Suzuki | |

It is certified that error appears in the above-identified patent and that said Letters Patent is hereby corrected as shown below:

Column 14, line 20 (Claim 4, Line 1), delete "claim 1" and insert --claim 3--.

Column 14, line 49 (Claim 9, Line 1), delete "claim 3" and insert --claim 2--.

Signed and Sealed this

Twelfth Day of October, 2010

David J. Kappos
*Director of the United States Patent and Trademark Office*